(12) United States Patent
Zheng et al.

(10) Patent No.: US 10,886,662 B2
(45) Date of Patent: Jan. 5, 2021

(54) ELECTRICAL CARD CONNECTOR

(71) Applicants: FU DING PRECISION COMPONENT (SHEN ZHEN) CO., LTD., Shenzhen (CN); FOXCONN INTERCONNECT TECHNOLOGY LIMITED, Grand Cayman (KY)

(72) Inventors: Chang-Long Zheng, Kunshan (CN); Fu-Jin Peng, Kunshan (CN)

(73) Assignees: FUDING PRECISION COMPONENTS (SHENZHEN) CO., LTD., Shenzhen (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/596,737

(22) Filed: Oct. 8, 2019

(65) Prior Publication Data

US 2020/0112126 A1   Apr. 9, 2020

(30) Foreign Application Priority Data

Oct. 8, 2018   (CN) ...................... 2018 2 1629967 U

(51) Int. Cl.
*H01R 13/62*   (2006.01)
*H01R 13/627*  (2006.01)
(Continued)

(52) U.S. Cl.
CPC ... *H01R 13/6275* (2013.01); *H01R 13/62988* (2013.01); *H05K 5/0295* (2013.01);
(Continued)

(58) Field of Classification Search
CPC .......... H01R 13/6275; H01R 13/62988; H01R 24/62
(Continued)

(56) References Cited

U.S. PATENT DOCUMENTS 7,118,394 B2 * 10/2006 Yoneyama ............. G06K 13/08
                                                      439/159
7,318,733 B2 *  1/2008 Wang .................... G06K 13/08
                                                      439/159

(Continued)

FOREIGN PATENT DOCUMENTS

CN           100349328 C       11/2007

*Primary Examiner* — Alexander Gilman
(74) *Attorney, Agent, or Firm* — Wei Te Chung; Ming Chieh Chang

(57) ABSTRACT

An electrical card connector includes an insulative housing, a plurality of contacts retained to the housing, a metallic shield attached to the housing and cooperating with the housing to form a receiving cavity for receiving therein an electrical card, and a card holding mechanism located beside the receiving cavity. The card holding mechanism includes a slider, a spring abutting against the slider and deformable in the front-to-back direction, and a resilient locking device. The locking device includes a securing part retained to the slider, a resilient arm extending from the securing part with a locking protrusion for engagement within a locking notch of the electrical card. The slider provides an abutment face. The free end of the locking arm is adapted to abut against the abutment face when the electrical card is inserted into or withdrawn from the receiving cavity to outwardly deflect the resilient arm.

19 Claims, 7 Drawing Sheets

(51) Int. Cl.
*H01R 13/629* (2006.01)
*H05K 5/02* (2006.01)
*H01R 107/00* (2006.01)
*H01R 13/6581* (2011.01)
*H01R 24/62* (2011.01)

(52) U.S. Cl.
CPC .......... *H01R 13/6581* (2013.01); *H01R 24/62* (2013.01); *H01R 2107/00* (2013.01)

(58) Field of Classification Search
USPC ........................................................ 439/159
See application file for complete search history.

(56) References Cited

U.S. PATENT DOCUMENTS

| | | | | |
|---|---|---|---|---|
| 7,422,485 B2* | 9/2008 | Yu | ........................ | G06K 7/0021 439/630 |
| 7,708,575 B2* | 5/2010 | Motojima | ............ | G06K 7/0021 439/159 |
| 7,866,998 B2* | 1/2011 | Chen | .................... | G06K 7/0047 439/159 |
| 7,988,473 B2* | 8/2011 | Tsai | ..................... | H05K 5/0295 439/159 |
| 8,221,143 B2* | 7/2012 | Yu | ........................ | G06K 7/0021 439/159 |
| 8,231,395 B2* | 7/2012 | Li | ........................ | G06K 7/0021 439/159 |
| 8,382,498 B2* | 2/2013 | Yu | ........................ | H01R 13/635 439/159 |
| 9,084,935 B2* | 7/2015 | Kamada | .................. | A63F 13/95 |
| 2004/0014342 A1* | 1/2004 | Yu | ..................... | H01R 12/7005 439/159 |
| 2005/0282440 A1* | 12/2005 | Tseng | .................. | H01R 13/405 439/630 |
| 2009/0221168 A1* | 9/2009 | Yu | ........................ | G06K 7/0021 439/159 |
| 2009/0246993 A1* | 10/2009 | Yu | ........................ | H01R 13/633 439/159 |
| 2009/0253280 A1* | 10/2009 | Yu | .......................... | G06K 13/08 439/159 |
| 2011/0230072 A1* | 9/2011 | Yu | ..................... | H01R 12/7094 439/159 |
| 2020/0112126 A1* | 4/2020 | Zheng | .................. | H05K 5/0295 |

* cited by examiner

ELECTRICAL CARD CONNECTOR

BACKGROUND OF THE INVENTION

1. Field of the Invention

The present invention relates generally to an electrical card connector, and particularly to the card connector having the resilient locking arm extending in a cantilevered manner while being adapted to abut against an abutment wall with two points by two sides of the locking protrusion during insertion or withdrawal of the card with regard to the card connector.

2. Description of Related Arts

China Utility Patent No. CN100349328C discloses an electrical card connector with a slider with the associated resilient locking arm having the corresponding locking protrusion around the free end and adapted to be outwardly and laterally moved during insertion or withdrawal of the card with regard to the electrical connector. Notably, the locking arm is adapted to be outwardly deflectable to have the corresponding locking protrusion outwardly moved when the slider is located in an outer position for loading/unloading the corresponding card, or be immovable when the slider is located in the inner position for retaining the card in the operational state. Anyhow, the locking protrusion essentially confronts the abutment wall provided by the housing in either situation, and such arrangement may tend to be unstable due to the movement of the slider along the front-to-back direction.

It is desirable to provide an electrical card connector with the slider equipped with a resilient locking arm having the locking protrusion thereon wherein the resilient arm provides two abutment points by two sides of the locking arm against an abutment wall formed on the slider instead of the housing.

SUMMARY OF THE INVENTION

An object of the invention is to provide an electrical card connector with an insulative housing, a plurality of contacts retained to the housing, a metallic shield attached to the housing and cooperating with the housing to form a receiving cavity for receiving therein an electrical card having a locking notch thereof, and a card holding mechanism located beside the receiving cavity. The card holding mechanism includes a slider, a spring abutting against the slider and deformable in the front-to-back direction, and a resilient locking device. The locking device includes a securing part retained to the slider, a resilient arm extending from the securing part with a locking protrusion for engagement within the locking notch of the electrical card. The slider provides an abutment face of an abutment wall. The free end of the locking arm is adapted to abut against the abutment face when the electrical card is inserted into or withdrawn from the receiving cavity to outwardly deflect the resilient arm. The spring arm further includes a transitional section, which is located the other side of the locking protrusion opposite to the free end, confronting the abutment face of the abutment wall so as to abut against the abutment face when the resilient arm is outwardly deflected. Therefore, the spring arm is converted from the cantilevered beam to a constrained continuous beam.

DETAILED DESCRIPTION OF THE PREFERRED EMBODIMENT

Figure 1:
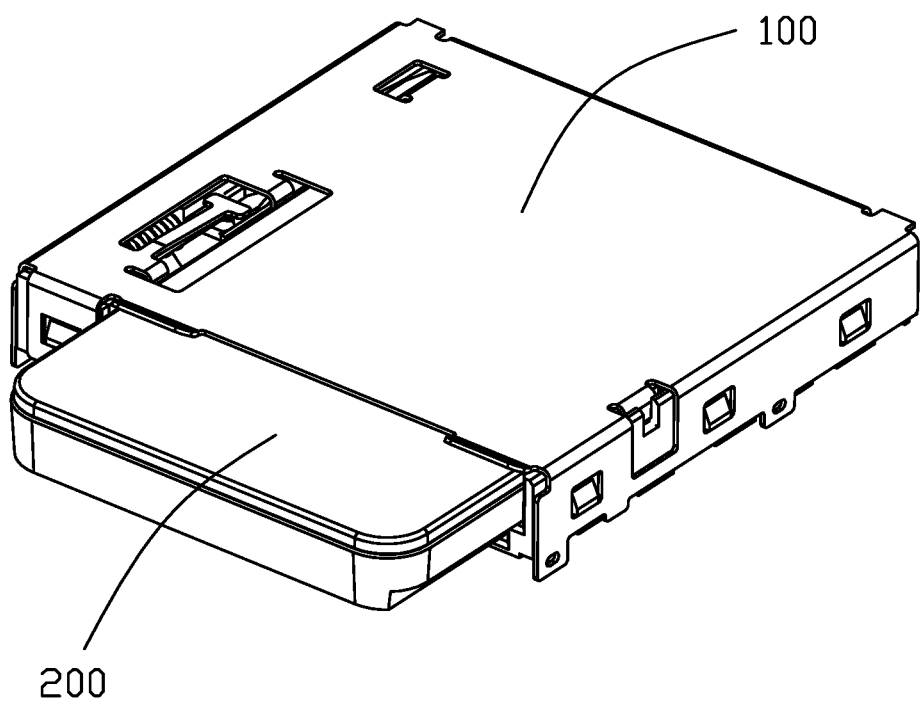
FIG. 1 is a perspective view of an electrical card connector with a corresponding card, according to the invention.
Figure 2:
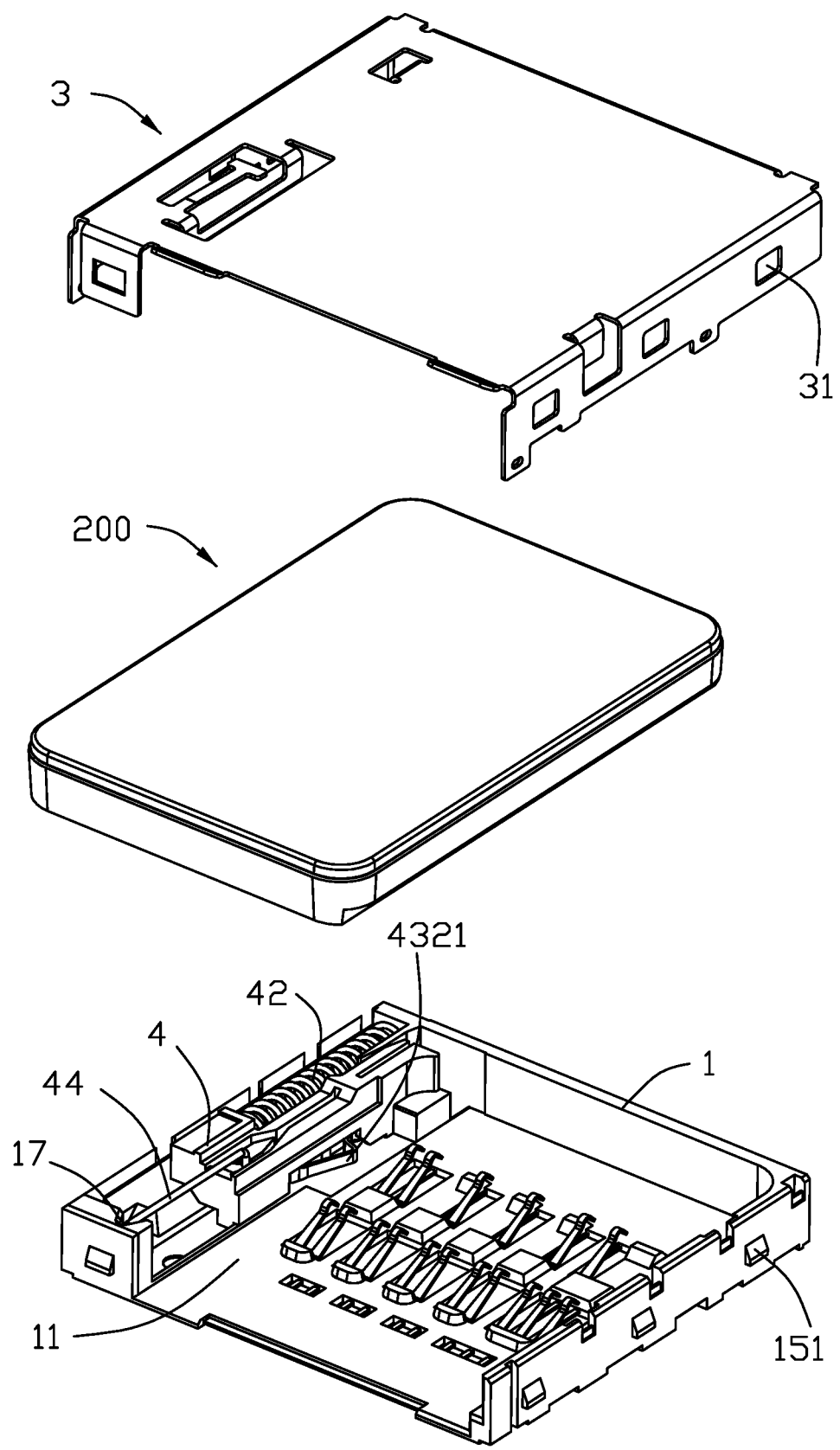
FIG. 2 is an exploded perspective view of the electrical card connector with the card of FIG. 1.
Figure 3:
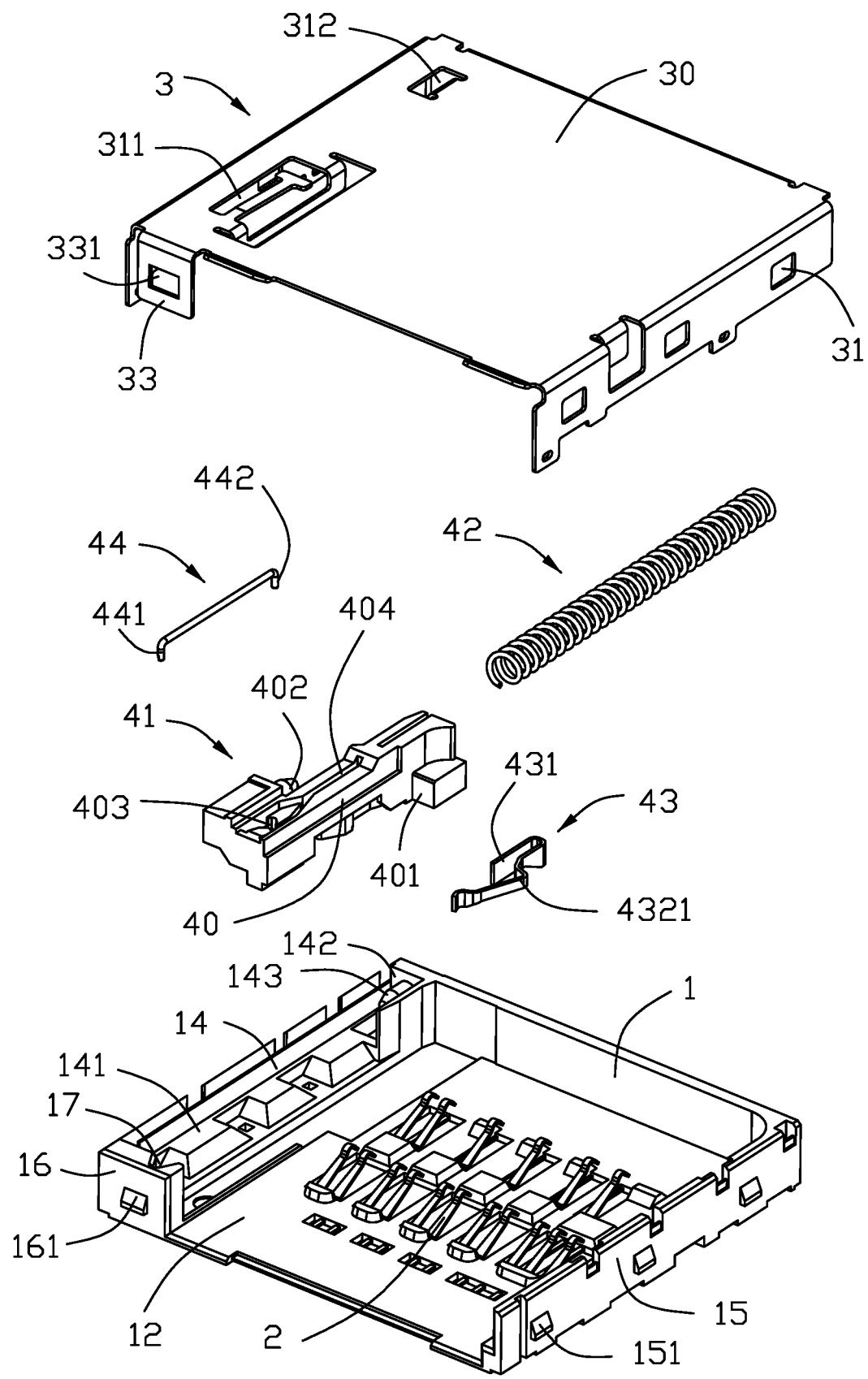
FIG. 3 is a further exploded perspective view of the electrical card connector of FIG. 2.
Figure 4:
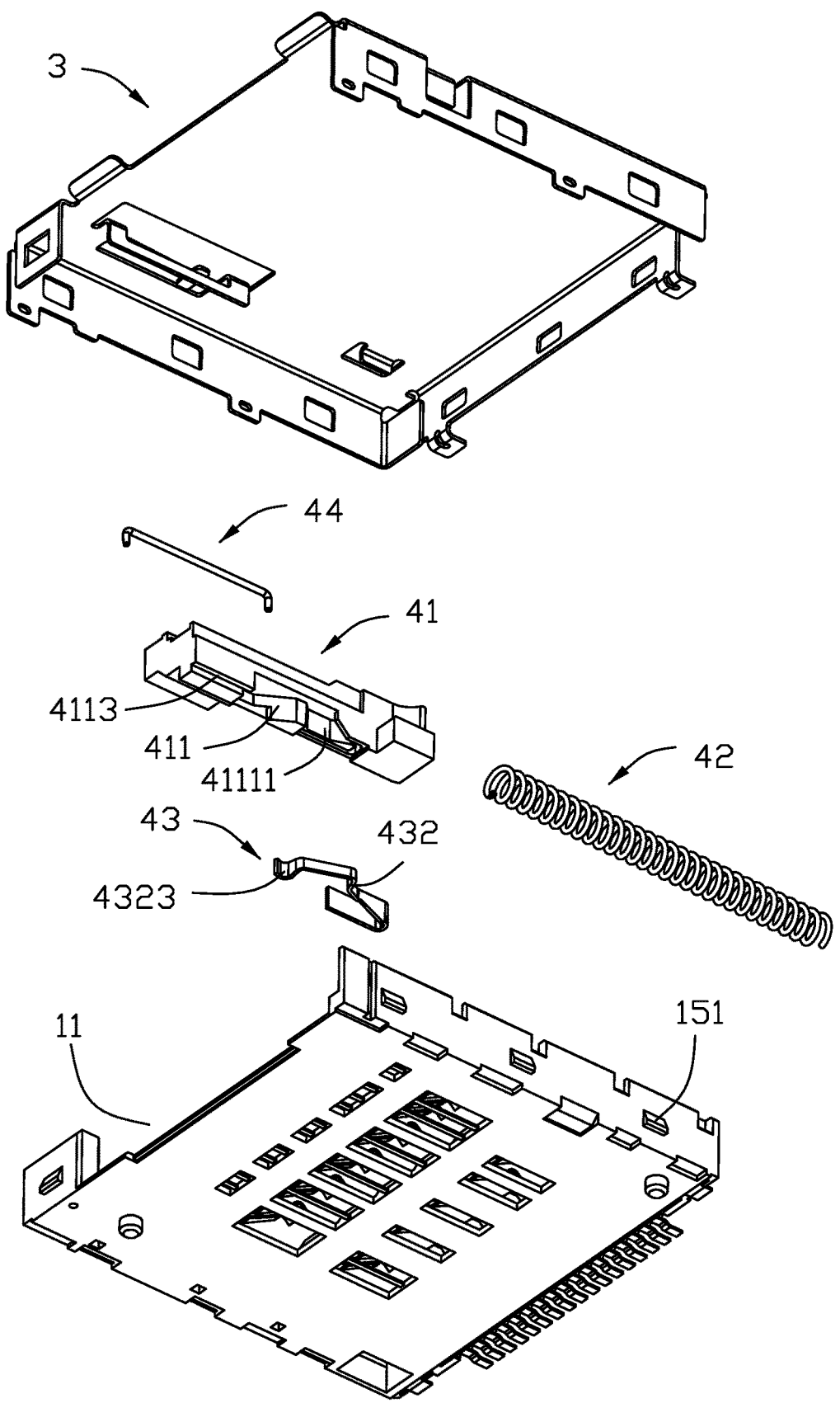
FIG. 4 another exploded perspective view of the electrical card connector of FIG. 3.
Figure 5:
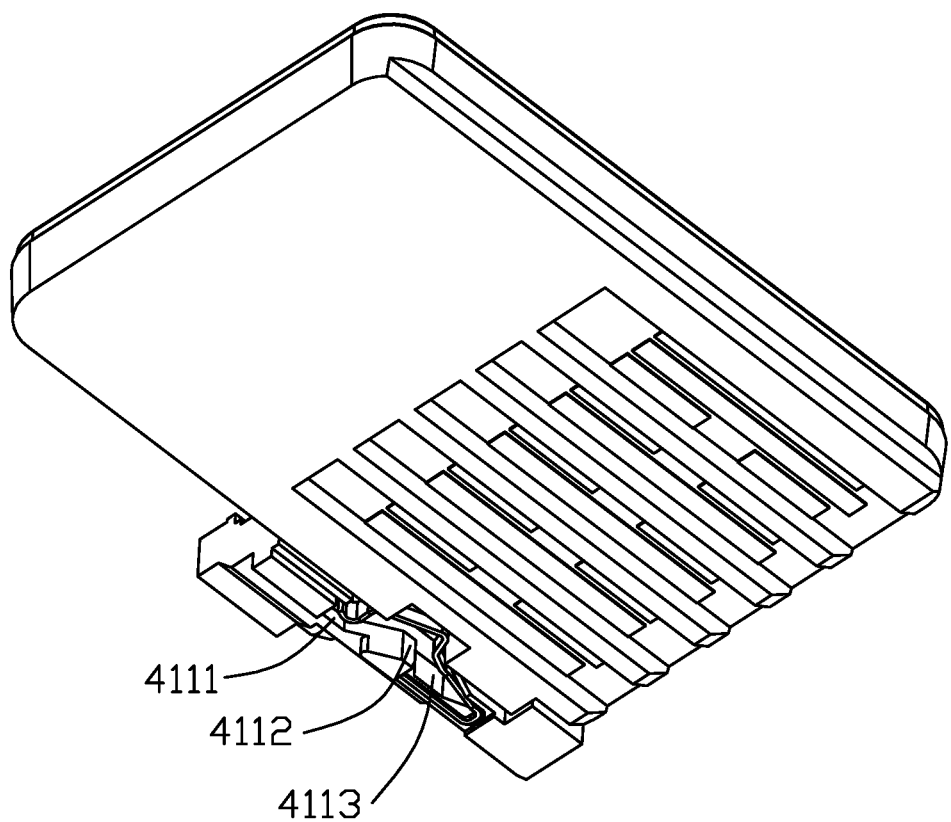
FIG. 5 is a perspective view of the card holding mechanism and the card of the electrical card connector of FIG. 1.
Figure 6:
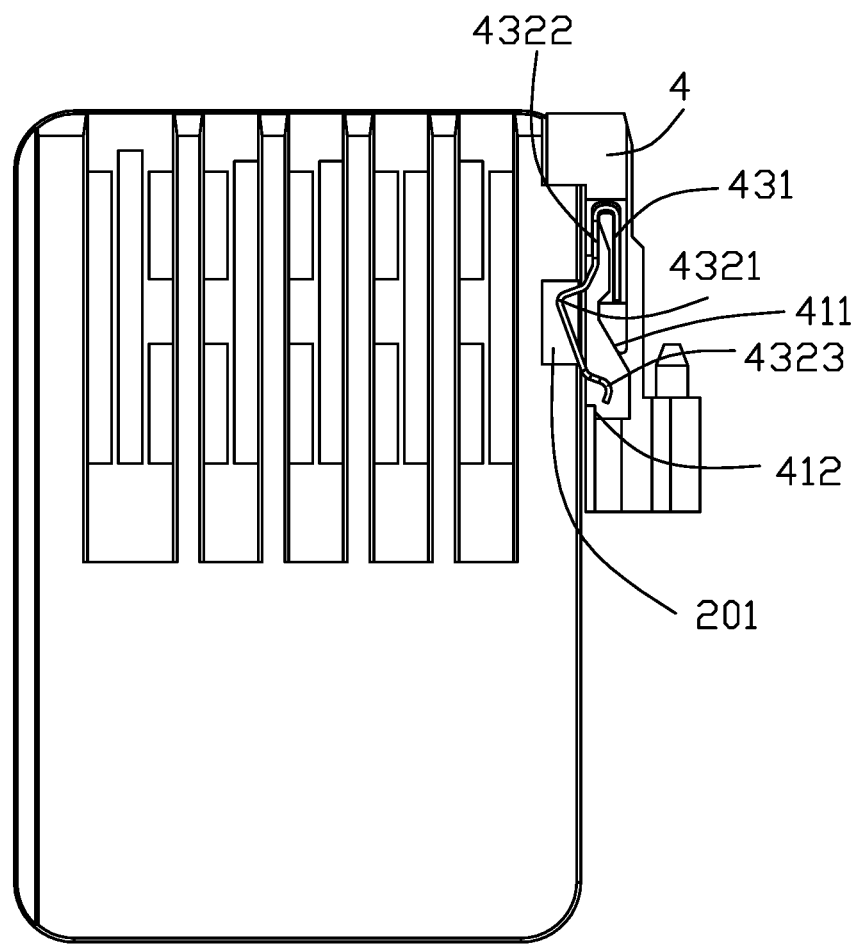
FIG. 6 is a plan view of the card holding mechanism and the card of FIG. 1 when the card holding mechanism retains the card.
Figure 7:
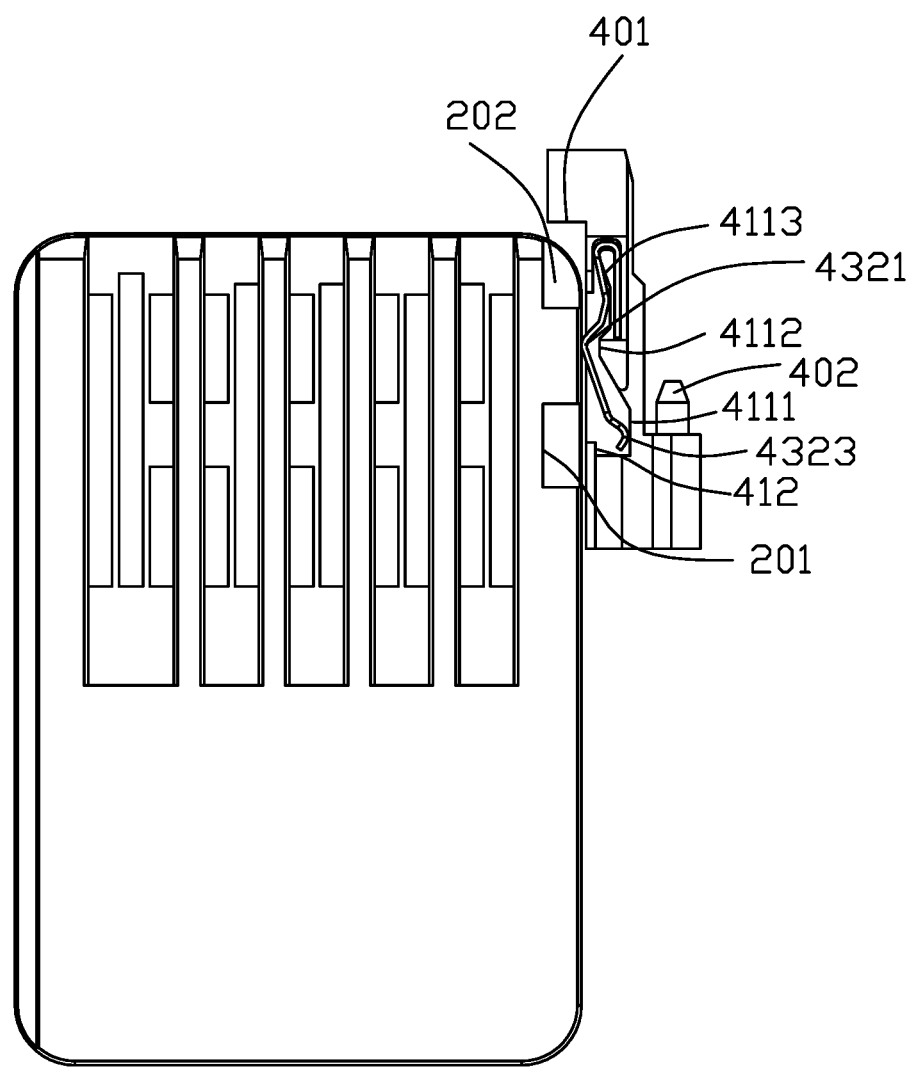
FIG. 7 is a plan view of the card holding mechanism and the card of FIG. 1 when the card is removed from the card holding mechanism.

Referring to FIGS. 1-7, an electrical card connector 100 for receiving an electronic card 200 having a locking notch thereof, includes an insulative housing 1, a plurality of contacts 2 retained to the housing 1, a metallic shield 3 attached upon the housing 1 and cooperating with the housing 1 to form a card receiving cavity 11, and a card holding mechanism 4 beside the receiving cavity 11.

The housing 1 includes a bottom wall 12, a rear wall 13 behind the receiving cavity 11, opposite first side wall 14 and second side wall 15, and a front mating side 16. The first side wall 14 forms a receiving space 141 to receive the card holding mechanism 4. A fixing portion 142 is located behind the receiving space 141, and a fixing post 143 forwardly extends from the fixing portion 142. A plurality of securing protrusions 151 are formed on both the first side wall 14 and the second side wall 15. A securing protrusion 161 is formed upon the front mating side 16.

The card holding mechanism 4 includes a slider 41 moveably received within the receiving space 141, a spring 42 pressing the slide 41 along the front-to-back direction, a resilient locking device 43 adapted to be locked within the locking notch 201 of the card 200, and a linking pin 44 linked between the housing 1 and the slider 41.

The resilient locking device 43 includes a securing part 431, and a resilient arm 432 extending curvedly from the securing part 431 and including a locking protrusion 4321 to be engaged within the locking notch 201 of the card 200. The resilient arm 432 includes a transitional section 4322 located between the securing part 431 and the locking protrusion 4321, and a hook 4323 located in front of the locking protrusion 4321. The slider 41 includes a main body 40, a pushing section 401 for rearwardly abutting against the electronic card 200 and a fixing post 402 respectively located at two opposite ends of the main body 40. One end of the spring 42 is secured to the fixing post 143 and the other end of the spring 42 is secured to the fixing post 402. Understandably, the spring 42 may urge the slider 41 to move outwardly/forwardly from the inner position to the outer position, thus resulting in movement of the card 200 associatively. The card 200 further includes a recess 202 in front of the locking notch 201 to receive the pushing section 401 during back-and-forth operation of the slider 41 along the front-to-back direction.

The slider 41 includes an abutment face 411 opposite to the spring arm 432 in a transverse direction perpendicular to the front-to-back direction. The slider 41 forms a stopper 412 in confrontation with the hook 4323 for preventing excessive inward movement of the hook 4323. The transitional section 4322 and the hook 4323 extend toward the abutment face 411 while the locking protrusion 4321 extends away from the abutment face 411. Understandably, during outward deflection of the sprint arm 432 in the transverse direction in response to insertion or withdrawal of the card with regard to the receiving cavity 11, the hook 4323 will abut against the abutment face 411. Notably, the abutment face 411 is formed in a recess (not labeled) in a bottom side of the slider 41, and said recess receives the securing part 431 and allows the locking protrusion 4321 to extend into the receiving cavity 11 in the transverse direction. The abutment face 411 includes a first section 4111 corresponding to the hook 4323, the second section 4112 corresponding to the locking protrusion 4321, and a third section 4113 corresponding to the transitional section 4322, wherein the hook 4323 abuts the first section 4111 and the transitional section 4322 abuts against the third section when the resilient arm 432 is outwardly deflected in the transverse direction.

The slider 41 includes a heart like groove 403 and a sliding groove 404 communicating with the heart like groove 403. The housing 1 forms a fixing hole 17. One end of the linking pin 44 is retained to the fixing hole 17, and the other end of the linking pin 44 is moveably received within the heart like groove 403. When the card 200 is inserted into or withdrawn from the receiving cavity 11, the forward movement of the slider 41 will result in movement of the linking pin 44 in the heart like groove 403. It is well known that the card 200 can be inserted into the receiving cavity 11 via a pushing action, and withdrawn therefrom via another pushing action.

In detail, the linking pin 17 has a first end 441 fixed to the fixing hole 17, and a second end 442 moveable along the heart like groove 403. The forward movement of the slider 41 due to insertion of the card 200 may compress the spring 42 to have the slider 41 located in the inner position and the second end 442 located at the top apex for holding the slider 41 in position. Oppositely, via another pushing action upon the card 200 to activate the slider 41, the second end 442 will be released from the top apex, and the slider 41 will be forwardly moved by the spring force derived from the spring 42 so as to have the second end 442 move into the sliding groove 404 toward the fixing post 143.

The metallic shield 3 includes a top wall 30, a pair of side walls 32, and a front wall 33. The top wall 30 includes a spring tang 311 pressing the card holding mechanism 4 in the vertical direction, and a stopper 312. The side wall 32 forms a plurality of holes 31 to receive the corresponding securing protrusions 151, and the front wall 33 forms a hole 331 to receive the corresponding securing protrusion 161.

In conclusion, the spring arm 432 of the locking device 43 performs as a cantilevered beam when the locking protrusion 4321 is received within the locking notch 201. Anyhow, when the card 200 is intentionally withdrawn from the receiving cavity or inserted thereinto, the spring arm 432 is outwardly deflected to have the hook 4323 abut against the first section 4111 of the abutment face 411, and the transitional section 4322 abut against the third section 4113 so as to perform as a continuous constrained beam instead of the cantilevered beam. Notably, the hook 4323 may be engaged with the stopper 412 when no card 200 is received within the receiving cavity 11 so as to have the spring arm 432 in a preloaded manner.

What is claimed is:

1. An electrical card connector comprising:
an insulative housing cooperating with a metallic shield attached thereto to commonly form a receiving cavity for receiving an electronic card along a front-to-back direction;
a plurality of contacts retained in the housing and extending into the receiving cavity in a vertical direction perpendicular to the front-to-back direction;
a receiving space forms in the housing to receive a card holding mechanism and sidewardly communicating with the receiving cavity in a transverse direction perpendicular to both the front-to-back direction and the vertical direction, said card holding mechanism including:
a slider received within the receiving space and moveable along the front-to-back direction with an abutment face thereon;
a spring located between the housing and the slider to constantly urge the slider forwardly;
a spring arm attached to the slider and including a locking protrusion extending into the receiving cavity sidewardly in the transverse direction for engagement within a locking notch of the electronic card received within the receiving cavity, and a hook around a free end; wherein
the spring arm extends in a cantilevered manner when there is no card received within the receiving cavity or the electronic card is completely received within the receiving cavity while the spring arm extends in a constrained manner via abutment between the hook and the abutment face of the slider when the electronic card is inserted into or withdrawn from the receiving cavity by outwardly and sidewardly deflecting the spring arm in the transverse direction; wherein
in the vertical direction, the slider forms a heart like groove located an upper level and upwardly facing toward the metallic shield while the spring arm is located at a lower level and downwardly facing toward the insulative housing.

2. The electrical card connector as claimed in claim 1, wherein the spring arm further includes a transitional section by another side of the locking protrusion opposite to the hook, and said transitional section abuts against the abutment face when the spring arm is outwardly deflected.

3. The electrical card connector as claimed in claim 2, wherein the locking protrusion extends sidewardly toward the receiving cavity while the hook extends sidewardly away from the receiving cavity in the transverse direction.

4. The electrical card connector as claimed in claim 2, wherein the spring arm includes a securing part retained to the slider and extending parallel to the transitional section.

5. The electrical card connector as claimed in claim 2, wherein the spring arm includes a securing part retained to the slider, and the transitional section is unitarily formed between the securing part and the locking protrusion, and the transitional section and the securing part commonly form a U-shaped configuration.

6. The electrical card connector as claimed in claim 1, wherein the slider forms a stopper, and the hook abuts against the stopper when no card is received within the receiving cavity.

7. The electrical card connector as claimed in claim 1, wherein the spring is located beside the slider in the transverse direction.

8. An electrical card connector comprising:

an insulative housing cooperating with a metallic shield attached thereto to commonly form a receiving cavity for receiving an electronic card along a front-to-back direction;

a plurality of contacts retained in the housing and extending into the receiving cavity in a vertical direction perpendicular to the front-to-back direction;

a receiving space forms in the housing to receive a card holding mechanism and sidewardly communicating with the receiving cavity in a transverse direction perpendicular to both the front-to-back direction and the vertical direction, said card holding mechanism including:

a slider received within the receiving space and moveable along the front-to-back direction with an abutment face thereon;

a spring located between the housing and the slider to constantly urge the slider forwardly;

a spring arm attached to the slider and including a locking protrusion extending into the receiving cavity sidewardly in the transverse direction for engagement within a locking notch of the electronic card received within the receiving cavity, and a hook around a free end; wherein the spring arm extends in a cantilevered manner when there is no card received within the receiving cavity or the electronic card is completely received within the receiving cavity while the spring arm extends in a constrained manner via abutment between the hook and the abutment face of the slider when the electronic card is inserted into or withdrawn from the receiving cavity by outwardly and sidewardly deflecting the spring arm in the transverse direction; wherein the slider forms a stopper, and the hook abuts against the stopper when no card is received within the receiving cavity so as to prevent excessive inward movement of the hook and have the spring arm in a preloaded manner.

9. The electrical card connector as claimed in claim 8, wherein the spring arm further includes a transitional section by another side of the locking protrusion opposite to the hook, and said transitional section abuts against the abutment face when the spring arm is outwardly deflected.

10. The electrical card connector as claimed in claim 9, wherein the locking protrusion extends sidewardly toward the receiving cavity while the hook extends sidewardly away from the receiving cavity in the transverse direction.

11. The electrical card connector as claimed in claim 9, wherein the spring arm includes a securing part retained to the slider and extending parallel to the transitional section.

12. The electrical card connector as claimed in claim 9, wherein the spring arm includes a securing part retained to the slider, and the transitional section is unitarily formed between the securing part and the locking protrusion, and the transitional section and the securing section commonly form a U-shaped configuration.

13. An electrical card connector assembly comprising:

an insulative housing cooperating with a metallic shield attached thereto to commonly form a receiving cavity to receive an electronic card along a front-to-back direction;

a plurality of contacts retained in the housing and extending into the receiving cavity in a vertical direction perpendicular to the front-to-back direction;

a receiving space forms in the housing to receive a card holding mechanism and sidewardly communicating with the receiving cavity in a transverse direction perpendicular to both the front-to-back direction and the vertical direction, said card holding mechanism including:

a slider received within the receiving space and moveable along the front-to-back direction with an abutment face thereon;

a spring located between the housing and the slider to constantly urge the slider forwardly;

a spring arm attached to the slider and including a locking protrusion extending into the receiving cavity sidewardly in the transverse direction for engagement within a locking notch of the electronic card received within the receiving cavity, and a hook around a free end; wherein the spring arm extends in a cantilevered manner when there is no card received within the receiving cavity or the electronic card is completely received within the receiving cavity while the spring arm extends in a constrained manner via abutment between the hook and the abutment face of the slider when the electronic card is inserted into or withdrawn from the receiving cavity by outwardly and sidewardly deflecting the spring arm in the transverse direction; wherein the slider forms a pushing section at a front end thereof to rearwardly abut against the electronic card, the spring arm downwardly faces toward the insulative housing, and both the pushing section and the spring arm are located at a lower level closer to the housing than to the metallic shield in the vertical direction.

14. The electrical card connector assembly as claimed in claim 13, wherein the spring arm further includes a transitional section by another side of the locking protrusion opposite to the hook, and said transitional section abuts against the abutment face when the spring arm is outwardly deflected.

15. The electrical card connector assembly as claimed in claim 14, wherein the locking protrusion extends sidewardly toward the receiving cavity while the hook extends sidewardly away from the receiving cavity in the transverse direction.

16. The electrical card connector assembly as claimed in claim 14, wherein the spring arm includes a securing part retained to the slider and extending parallel to the transitional section.

17. The electrical card connector assembly as claimed in claim 14, wherein the spring arm includes a securing part retained to the slider, and the transitional section is unitarily formed between the securing part and the locking protrusion, and the transitional section and the securing part commonly form a U-shaped configuration.

18. The electrical connector assembly as claimed in claim 13, wherein the electronic card forms a recess to receive the pushing section, and said recess is unexposed upwardly in the vertical direction.

19. The electrical connector assembly as claimed in claim 13, wherein the locking notch is unexposed upwardly in the vertical direction.

* * * * *